(12) United States Patent
Artman

(10) Patent No.: US 7,391,614 B2
(45) Date of Patent: Jun. 24, 2008

(54) METHOD AND APPARATUS FOR THERMAL DISSIPATION IN AN INFORMATION HANDLING SYSTEM

(75) Inventor: Paul T. Artman, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 271 days.

(21) Appl. No.: 11/089,162

(22) Filed: Mar. 24, 2005

(65) Prior Publication Data

US 2006/0215367 A1    Sep. 28, 2006

(51) Int. Cl.
*H05K 7/20*    (2006.01)

(52) U.S. Cl. ......................... 361/704; 165/80.3; 165/185

(58) Field of Classification Search ........................ None
See application file for complete search history.

(56) References Cited

U.S. PATENT DOCUMENTS

| | | | | |
|---|---|---|---|---|
| 4,366,527 A | * | 12/1982 | Bell | 361/722 |
| 5,323,295 A | * | 6/1994 | Pines | 361/709 |
| 5,574,626 A | * | 11/1996 | Smith | 361/204 |
| 5,926,367 A | * | 7/1999 | Gutierrez et al. | 361/695 |
| 5,991,151 A | * | 11/1999 | Capriz | 361/704 |
| 6,065,530 A | * | 5/2000 | Austin et al. | 165/80.3 |
| 6,114,761 A | * | 9/2000 | Mertol et al. | 257/722 |
| 6,122,169 A | * | 9/2000 | Liu et al. | 361/700 |
| 6,125,038 A | * | 9/2000 | Amaro et al. | 361/704 |
| 6,169,660 B1 | * | 1/2001 | Sarraf et al. | 361/717 |
| 6,351,382 B1 | * | 2/2002 | Nakanishi et al. | 361/700 |
| 6,397,941 B1 | * | 6/2002 | McCullough | 165/185 |
| 6,604,575 B1 | | 8/2003 | Degtiarenko | |
| 6,765,291 B2 | | 7/2004 | Corisis | |
| 6,798,661 B1 | * | 9/2004 | Barsun et al. | 361/700 |
| 2001/0047858 A1 | | 12/2001 | McCullough | |
| 2002/0024796 A1 | | 2/2002 | Shih | |
| 2002/0112846 A1 | | 8/2002 | Noda et al. | |
| 2003/0189815 A1 | | 10/2003 | Lee | |
| 2004/0036172 A1 | | 2/2004 | Azuma et al. | |

OTHER PUBLICATIONS

Search Report and Written Opinion issued by Austrian Patent Office, Singapore Patent Application No. 200601866-7, Mar. 2, 2008.

* cited by examiner

*Primary Examiner*—Boris Chërvinsky
(74) *Attorney, Agent, or Firm*—Haynes and Boone, LLP

(57) ABSTRACT

A thermal dissipation apparatus includes a primary heat sink. The primary heat sink includes a first base member having a component coupling surface and a secondary heat sink coupling surface, and a plurality of fins extending from the first base member. A secondary heat sink may be provided such that the primary heat sink is operable to provide thermal dissipation in a low profile form factor chassis while the secondary heat sink may be coupled with the primary heat sink to provide more optimal thermal dissipation in a high profile form factor chassis.

11 Claims, 9 Drawing Sheets

METHOD AND APPARATUS FOR THERMAL DISSIPATION IN AN INFORMATION HANDLING SYSTEM

BACKGROUND

The present disclosure relates generally to information handling systems, and more particularly to providing thermal dissipation in an information handling system.

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Meeting the cooling requirements for information handling systems under a variety of different boundary conditions can be difficult to achieve, and typically requires a number of different thermal solutions resulting in a variety of different thermal dissipation devices which are appropriate for each of the given boundary condition, which can increase costs.

In addition, industry standards groups are driving form factors for thermal dissipation devices which may not be applicable for the operating, performance, or volume constraints required by some information handling systems. Furthermore, common planar assemblies are driving thermal solutions that are sub-optimal for some platforms, which can result, for example, in a thermal solution for a first platform which may limit the thermal dissipation device height for second platform, even though that second platform provides the additional height needed for a more appropriate thermal solution.

Accordingly, it would be desirable to provide for enhanced thermal dissipation in an information handling system absent the disadvantages discussed above.

SUMMARY

According to one embodiment, a thermal dissipation apparatus is provided that includes a primary heat sink. The primary heat sink includes a first base member including a component coupling surface and a secondary heat sink coupling surface, and a plurality of fins extending from the first base member.

A principal advantage of this embodiment is that a thermal dissipation apparatus is provides thermal dissipation in a low profile form factor chassis but allows more optimal thermal dissipation in a high profile form factor chassis.

BRIEF DESCRIPTION OF THE DRAWINGS

FIG. 5b is a perspective view illustrating an embodiment of the primary heat sink of FIG. 2 coupled to the heat producing component and a low profile form factor chassis of FIG. 5a.

FIG. 6b is a perspective view illustrating an embodiment of the primary heat sink of FIG. 2 coupled to the heat producing component and a high profile form factor chassis of FIG. 6a.

FIG. 8 is a perspective view illustrating an embodiment of the primary heat sink of FIG. 7 coupled to the heat producing component and a low profile form factor chassis of FIG. 5a.

FIG. 9a is a perspective view illustrating an embodiment of the primary heat sink of FIG. 7 coupled to the heat producing component and a high profile form factor chassis of FIG. 6a.

FIG. 9b is a perspective view illustrating an embodiment of the secondary heat sink of FIG. 3 coupled to the primary heat sink, heat producing component, and a high profile form factor chassis of FIG. 9a.

DETAILED DESCRIPTION

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router or other network communication device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communications between the various hardware components.

Figure 1:
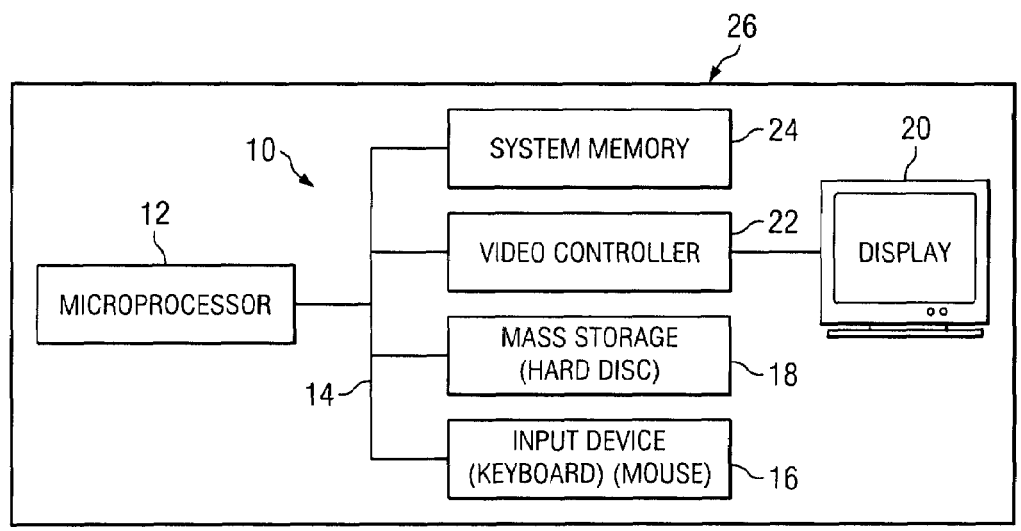
FIG. 1 is a schematic view illustrating an embodiment of an information handling system.

In one embodiment, information handling system 10, FIG. 1, includes a microprocessor 12, which is connected to a bus 14. Bus 14 serves as a connection between microprocessor 12 and other components of computer system 10. An input device 16 is coupled to microprocessor 12 to provide input to microprocessor 12. Examples of input devices include keyboards, touchscreens, and pointing devices such as mouses, trackballs and trackpads. Programs and data are stored on a mass storage device 18, which is coupled to microprocessor 12. Mass storage devices include such devices as hard disks, optical disks, magneto-optical drives, floppy drives and the like. Computer system 10 further includes a display 20, which is coupled to microprocessor 12 by a video controller 22. A system memory 24 is coupled to microprocessor 12 to provide the microprocessor with fast storage to facilitate execution of computer programs by microprocessor 12. In an embodiment, a chassis 26 may house some or all of the components of the information handling system 10. It should be understood that other busses and intermediate circuits can be deployed between the components described above and microprocessor 12 to facilitate interconnection between the components and the microprocessor.

Figure 2:
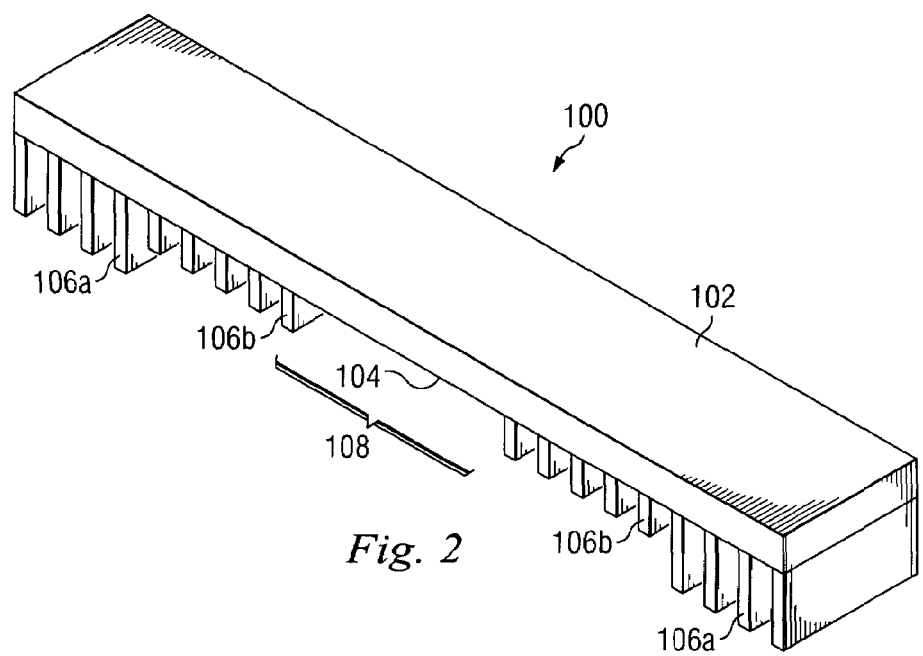
FIG. 2 is a perspective view illustrating an embodiment of a primary heat sink.

Referring now to FIG. 2, a primary heat sink 100 is illustrated. Primary heat sink 100 includes a secondary heat sink coupling surface 102 on its top surface, and a bottom surface 104 located opposite the secondary heat sink coupling surface 102. A plurality of long fins 106a extend from the bottom surface 104 of the primary heat sink 100 in a spaced apart relationship and are located adjacent the distal ends of the primary heat sink 100. A plurality of short fins 106b extend from the bottom surface 104 of the primary heat sink 100 in a spaced apart relationship and located adjacent the plurality of long fins 106a. A component coupling surface 108 is centrally located on the bottom surface 104 and is positioned between the plurality of long fins 106a and short fins 106b.

Figure 3:
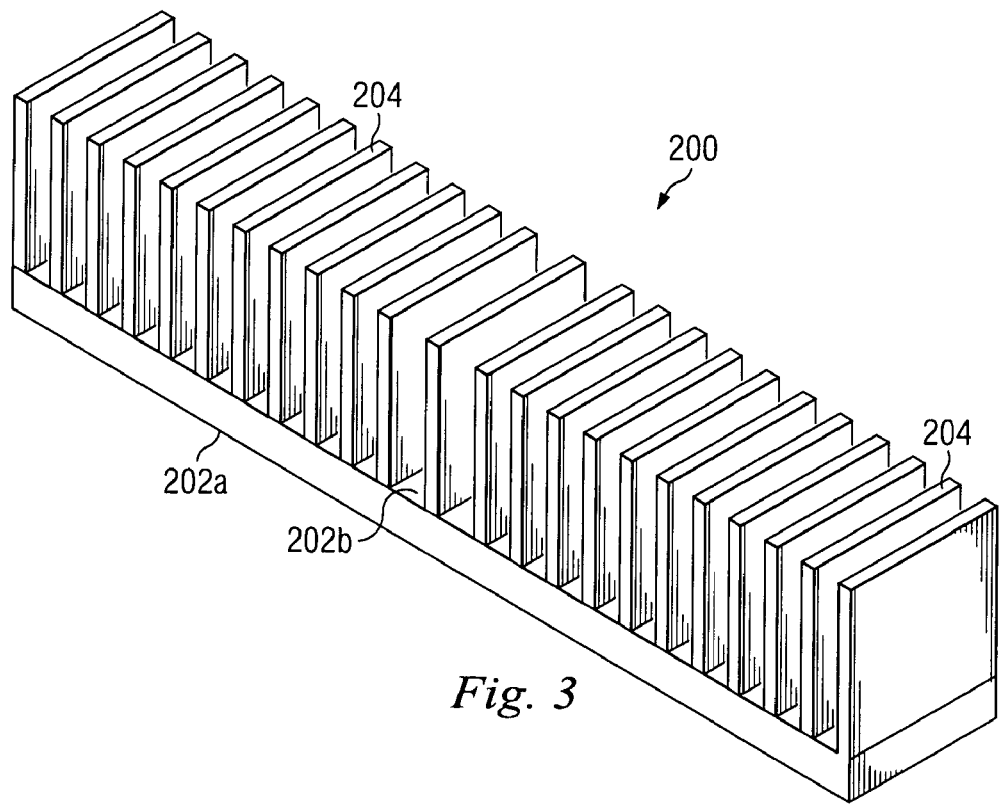
FIG. 3 is a perspective view illustrating an embodiment of a secondary heat sink which may be used with the primary heat sink of FIG. 2

Referring now to FIG. 3, a secondary heat sink 200 is illustrated. Secondary heat sink 200 includes a primary heat sink coupling surface 202a located on its bottom surface and a top surface 202b located opposite the primary heat sink coupling surface 202a. A plurality of fins 204 extend from the top surface 202b of the secondary heat sink 200 in a spaced apart relationship. In an embodiment, the secondary heat sink 200 may be a conventional heat sink known in the art.

Figure 4:
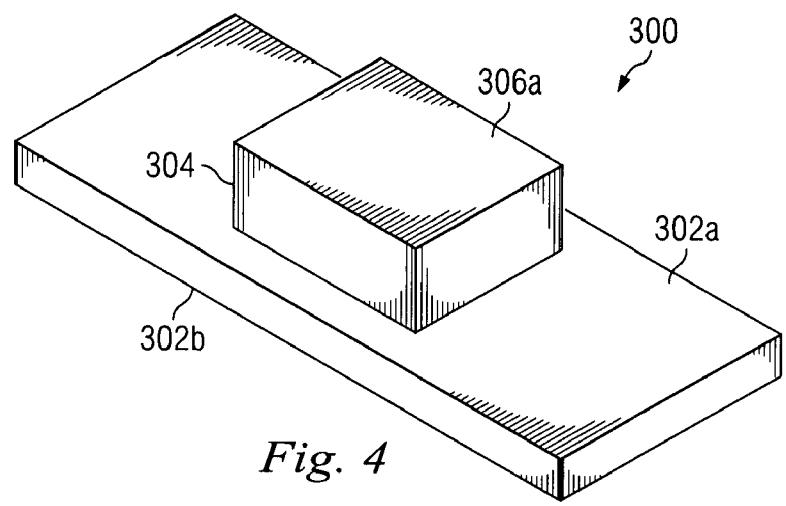
FIG. 4 is a perspective view illustrating an embodiment of a heat producing component used with the primary heat sink of FIG. 2 and which may be used with the secondary heat sink of FIG. 3.

Referring now to FIG. 4, a heat producing component 300 is illustrated. Heat producing component 300 includes a first surface 302a and a mounting surface 302b located opposite the first surface 302a. A die 304 extends from the first surface 302a and includes a top surface 306a and a bottom surface which is part of the mounting surface 302b. In an embodiment, the heat producing component 300 may be, for example, an exposed die chip set, a processor, or a variety of other heat producing components known in the art. In an embodiment, the heat producing component 300 may be one of the components of the information handling system 10, illustrated in FIG. 1. In an embodiment, the die 304 may include a lid.

Figure 5A:
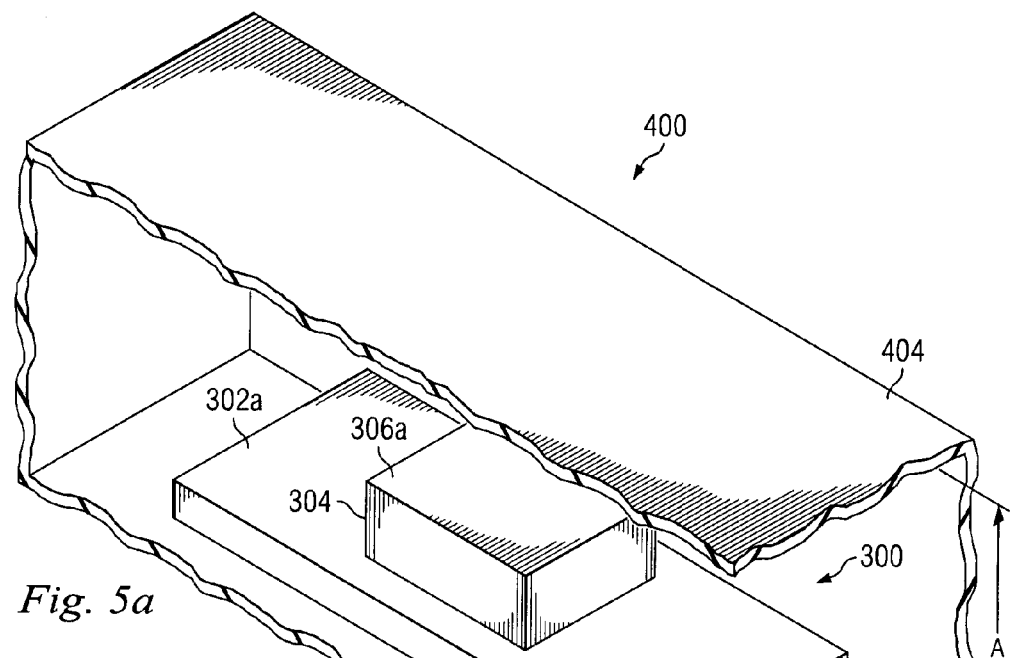
FIG. 5a is a perspective view illustrating an embodiment of the heat producing component of FIG. 4 mounted in a low profile form factor chassis.

Referring now to FIG. 5a, in operation, the heat producing component 300 may be mounted in a low profile form factor chassis 400. Low profile form factor chassis 400 includes a board 402, a lid 404, and provides an internal height A in the low profile form factor chassis 400 between the board 402 and the lid 404. In an embodiment, the low profile form factor chassis 400 may be the chassis 26 illustrated in FIG. 1. The mounting surface 302b of heat producing component 300 is mounted to the board 402 using methods known in the art and positioned between the board 402 and the lid 404. In an embodiment, the internal height A of the chassis 400 may be determined to be sufficient to house only the primary heat sink 100, illustrated in FIG. 2, when the primary heat sink is coupled to the heat producing component 300.

Figure 5B:
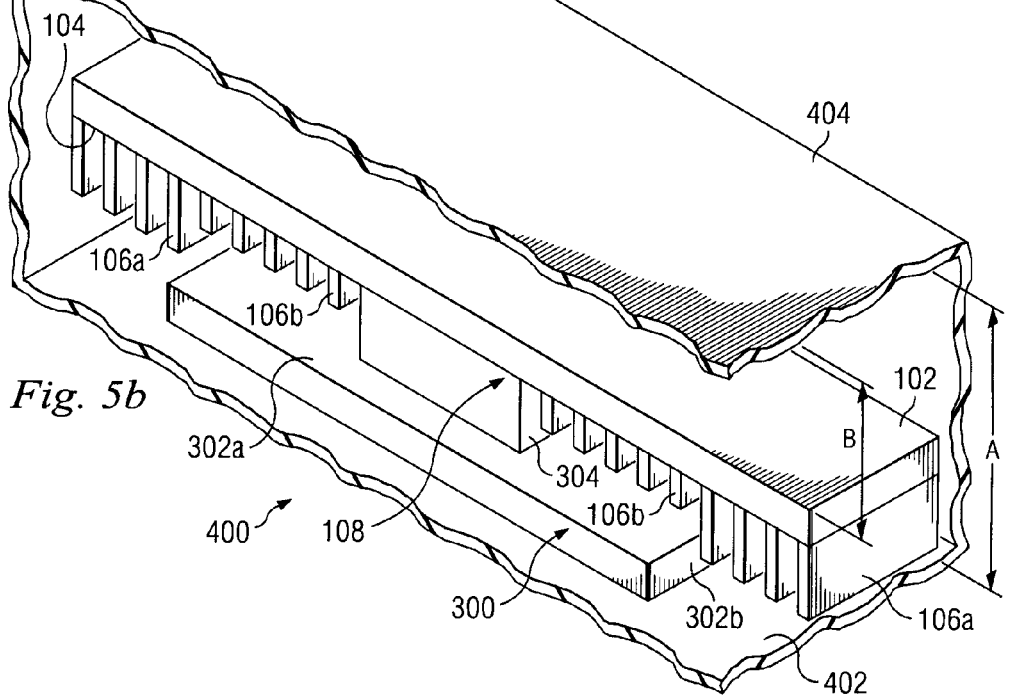

Referring now to FIG. 5b, the primary heat sink 100 may then be coupled to the die 300. Primary heat sink 100 is positioned over heat producing component 300 such that bottom surface 104 of primary heat sink 100 is facing the top surface 306a of die 304. Component coupling surface 108 is then lined up and engaged with top surface 306a of die 304. The component coupling surface 108 on primary heat sink 100 may be coupled to the top surface 306a of die 304 by a variety of methods known in the art such as, for example, an adhesive thermal interface material and/or a mechanical fastener. With the primary heat sink 100 coupled to the heat producing component 300 in low profile form factor chassis 400, an internal height B between the secondary heat sink coupling surface 102 and the lid 404 of chassis 400 is insufficient to allow the secondary heat sink 200, illustrated in FIG. 3, to be coupled to the primary heat sink 100.

Figure 6A:
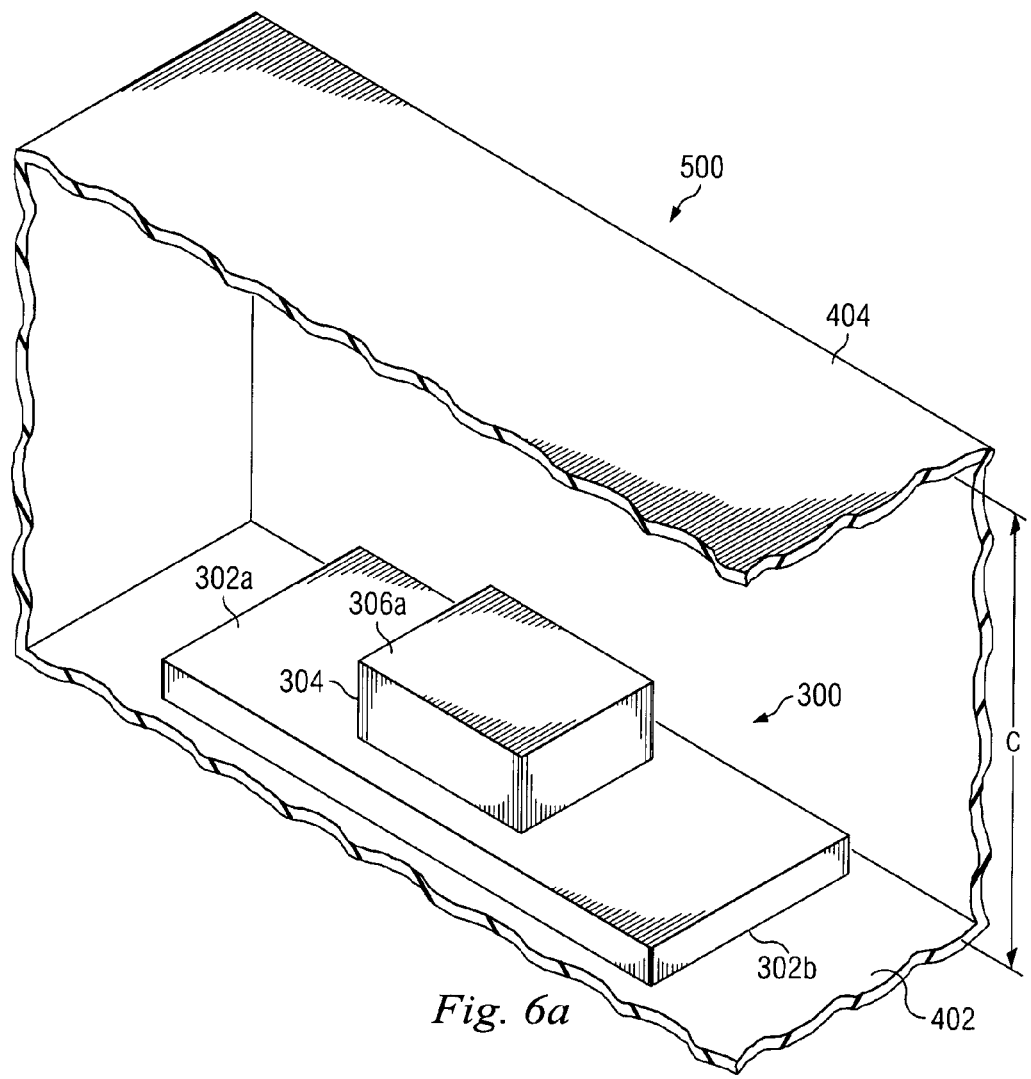
FIG. 6a is a perspective view illustrating an embodiment of the heat producing component of FIG. 4 mounted in a high profile form factor chassis.

Referring now to FIG. 6a, in an embodiment, the heat producing component 300 may be mounted in a high profile form factor chassis 500. High profile form factor chassis 500 is substantially similar to low profile form factor chassis 400, including a board 402 and a lid 404, with the exception of high profile form factor chassis 500 providing an internal height C in the high profile form factor chassis 500 between the board 402 and the lid 404 which is greater than the internal height A provided by the low profile form factor chassis 400. In an embodiment, the high profile form factor chassis 500 may be the chassis 26 illustrated in FIG. 1. The mounting surface 302b of heat producing component 300 is mounted to the board 402 using methods known in the art and positioned between the board 402 and the lid 404. In an embodiment, the internal height C of the chassis 500 may be determined to be sufficient to house the primary heat sink 100, illustrated in FIG. 2, with the secondary heat sink 200, illustrated in FIG. 3, coupled to the primary heat sink 100.

Figure 6B:
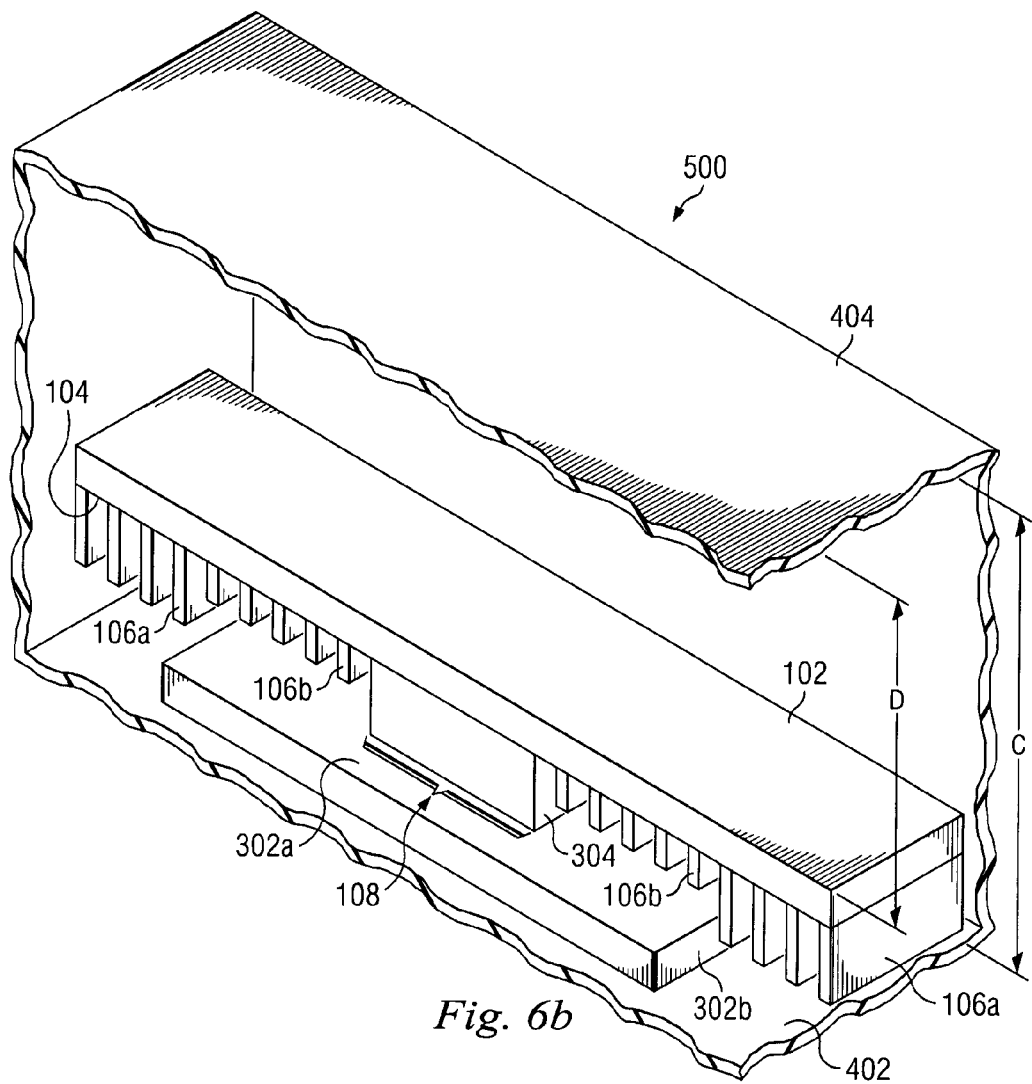

Referring now to FIG. 6b, the primary heat sink 100 may then be coupled to the die 300. Primary heat sink 100 is positioned over heat producing component 300 such that bottom surface 104 of primary heat sink 100 is facing the top surface 306a of die 304. Component coupling surface 108 is then lined up, engaged with, and coupled to the top surface 306a of die 304. The component coupling surface 108 on primary heat sink 100 may be coupled to the top surface of die 304 by a variety of methods known in the art such as, for example, an adhesive thermal interface material and/or a mechanical fastener. With the primary heat sink 100 coupled to the heat producing component 300 in high profile form factor chassis 500, an internal height D between the secondary heat sink coupling surface 102 and the lid 404 of chassis 500 is sufficient to allow the secondary heat sink 200, illustrated in FIG. 3, to be coupled to the primary heat sink 100.

Figure 6C:
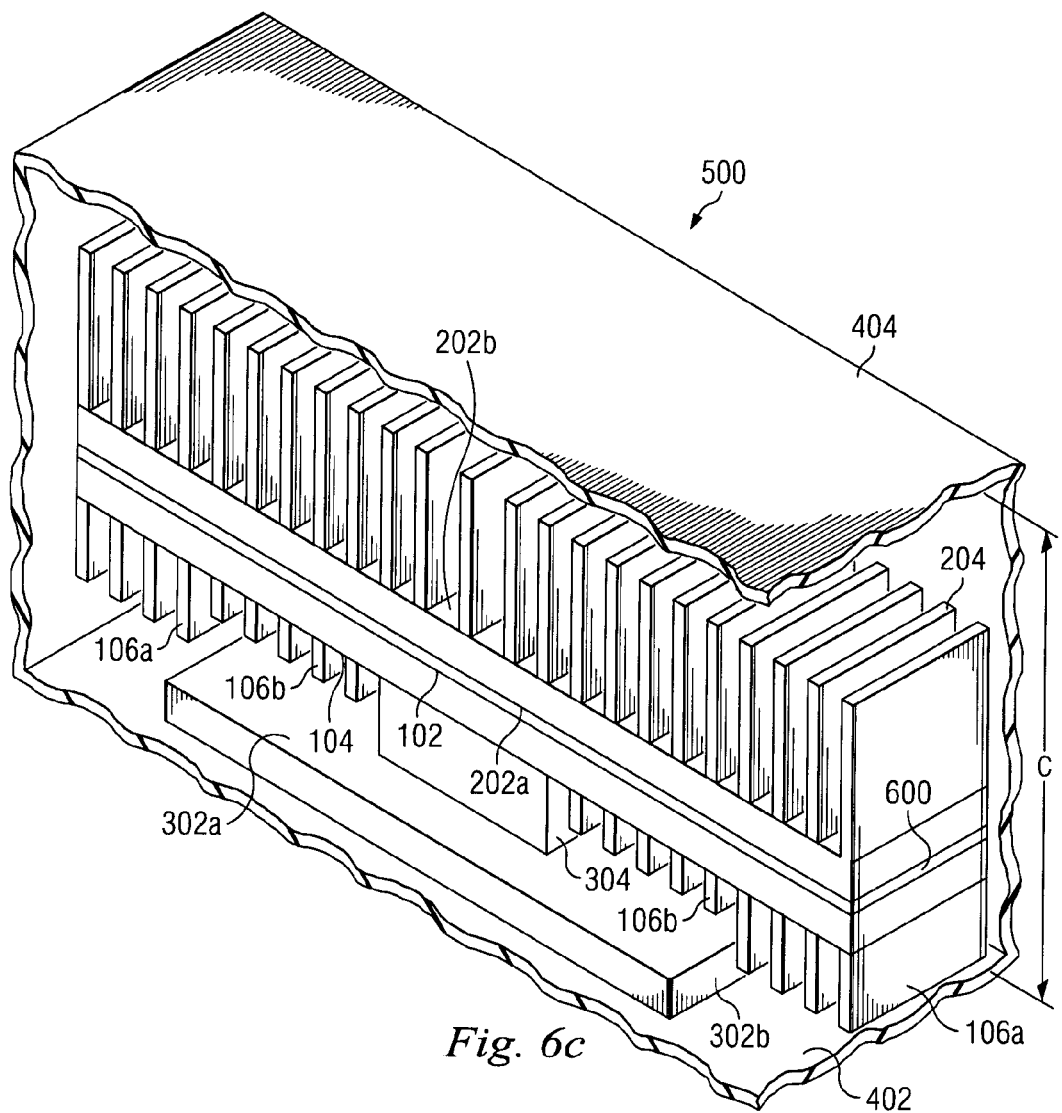
FIG. 6c is a perspective view illustrating an embodiment of the secondary heat sink of FIG. 3 coupled to the primary heat sink, heat producing component, and a high profile form factor chassis of FIG. 6b.

Referring now to FIGS. 3, 6b, and 6c, the secondary heat sink 200 may then be coupled to the primary heat sink 100. Secondary heat sink 200 is positioned in the high profile form factor chassis 500 such that bottom surface 202a of secondary heat sink 200 is adjacent secondary heat sink coupling surface 102 on primary heat sink 100. Secondary heat sink 200 may then be coupled to the primary heat sink 100 with the use of an adhesive thermal interface material 600 which couples the bottom surface 202a of secondary heat sink 200 to the secondary heat sink coupling surface 102 of primary heat sink 100. In an embodiment, the bottom surface 202a of secondary heat sink 200 may be coupled to the secondary heat sink coupling surface 102 on primary heat sink 100 using alternative methods known in the art such as, for example, with the use of mechanical fasteners. Thus, the primary heat sink 100 and the secondary heat sink 200 provide a thermal dissipation apparatus which may be used to provide thermal dissipation in a low profile form factor chassis but allows more optimal thermal dissipation in a high profile form factor chassis.

Figure 7:
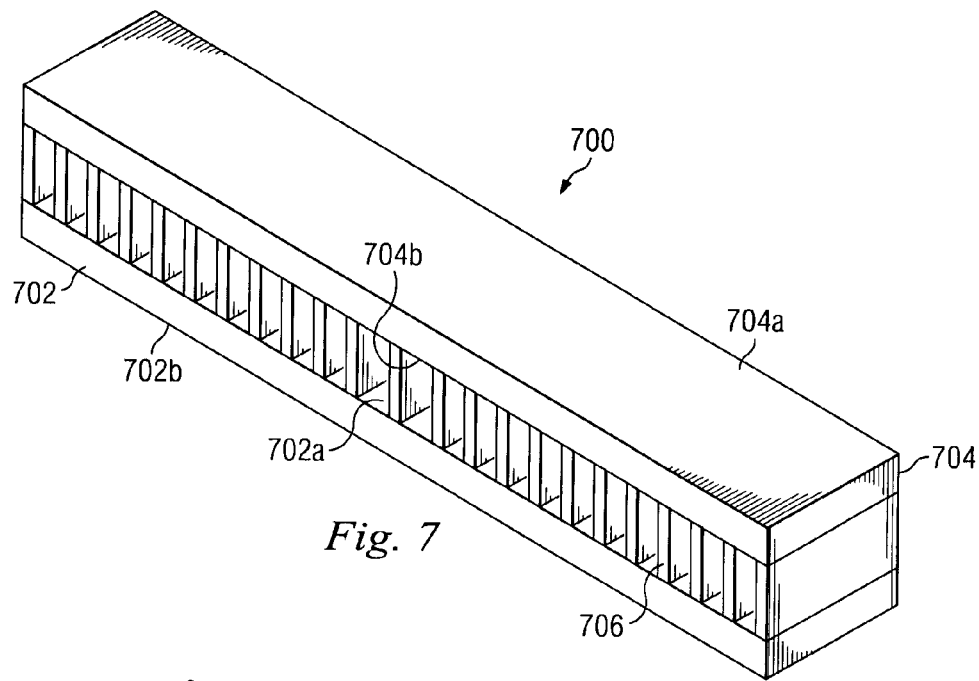
FIG. 7 is a perspective view illustrating an embodiment of a primary heat sink

Referring now to FIG. 7, an embodiment of a primary heat sink 700 is illustrated. Primary heat sink 700 includes a first base member 702 having a top surface 702a and a bottom surface 702b located opposite the top surface 702a. A second base member 704 includes a secondary heat sink coupling surface 704a located on its top surface, a bottom surface 704b located opposite the secondary heat sink coupling surface 704a, and is spaced apart and coupled to the first base member 702 by a plurality of fins 706 extending between the top surface 702a on first base member 702 and the bottom surface 704b on second base member 704.

Referring now to FIG. 5a, in operation, the heat producing component 300 may be mounted in a low profile form factor chassis 400. Low profile form factor chassis 400 includes a board 402, a lid 404, and provides an internal height A in the low profile form factor chassis 400 between the board 402 and the lid 404. In an embodiment, the low profile form factor chassis 400 may be the chassis 26 illustrated in FIG. 1. The mounting surface 302b of heat producing component 300 is mounted to the board 402 using methods known in the art and positioned between the board 402 and the lid 404. In an embodiment, the internal height A of the chassis 400 may be determined to be sufficient to house only the primary heat sink 700, illustrated in FIG. 7, when the primary heat sink 700 is coupled to the heat producing component 300.

Figure 8:
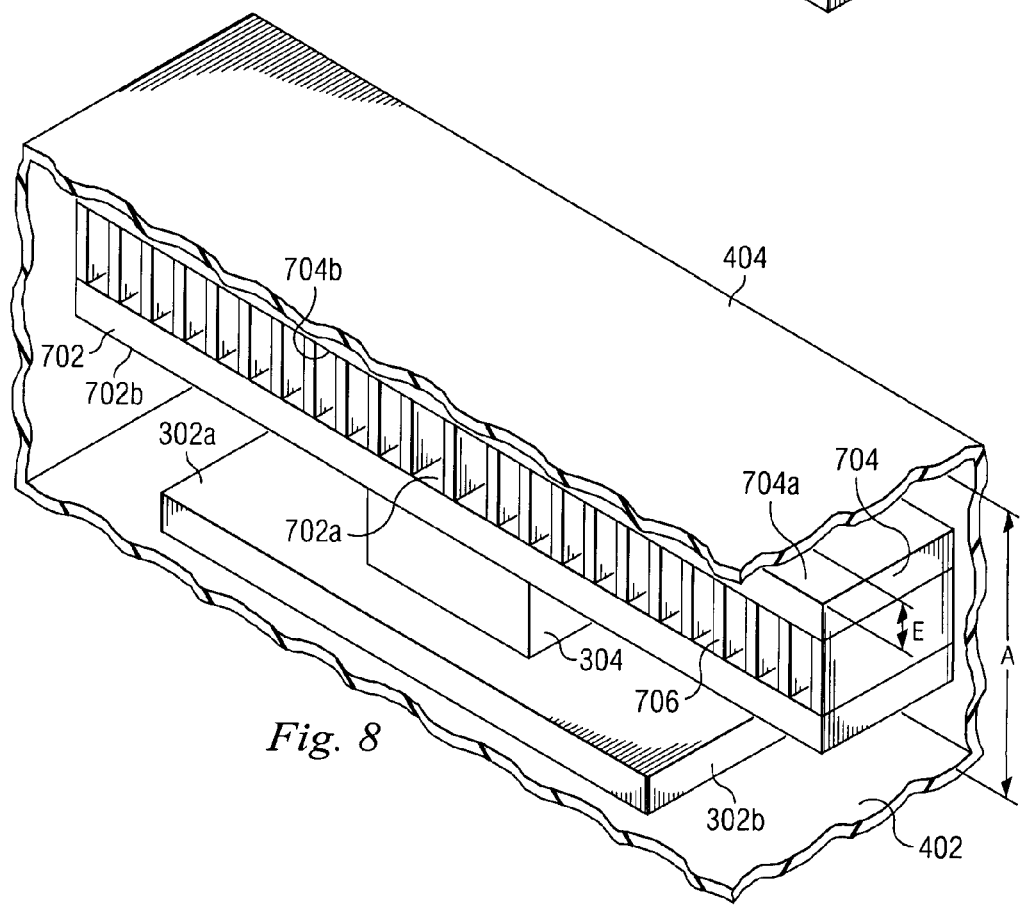

Referring now to FIG. 8, the primary heat sink 700 may then be coupled to the die 300. Primary heat sink 700 is positioned over heat producing component 300 such that bottom surface 702b on first base member 702 of primary heat sink 100 is facing the top surface 306a of die 304. Bottom surface 702b on first base member 702 is then engaged with top surface 306a of die 304. The bottom surface 702b on first base member 702 may be coupled to the top surface of die 304 by a variety of methods known in the art such as, for example, an adhesive thermal interface material and/or a mechanical fastener. With the primary heat sink 700 coupled to the heat producing component 300 in low profile form factor chassis 400, an internal height E between the secondary heat sink coupling surface 704a and the lid 404 of chassis 400 is insufficient to allow the secondary heat sink 200, illustrated in FIG. 3, to be coupled to the primary heat sink 700.

Referring now to FIG. 6a, in an embodiment, the heat producing component 300 may be mounted in a high profile form factor chassis 500. High profile form factor chassis 500 is substantially similar to low profile form factor chassis 400, including a board 402 and a lid 404, with the exception of high profile form factor chassis 500 providing an internal height C in the high profile form factor chassis 500 between the board 402 and the lid 404 which is greater than the internal height A provided by the low profile form factor chassis 400. In an embodiment, the high profile form factor chassis 500 may be the chassis 26 illustrated in FIG. 1. The mounting surface 302b of heat producing component 300 is mounted to the board 402 using methods known in the art and positioned between the board 402 and the lid 404. In an embodiment, the internal height C of the chassis 500 may be determined to be sufficient to house the primary heat sink 700, illustrated in FIG. 7, with the secondary heat sink 200, illustrated in FIG. 3, coupled to the primary heat sink 700.

Figure 9A:
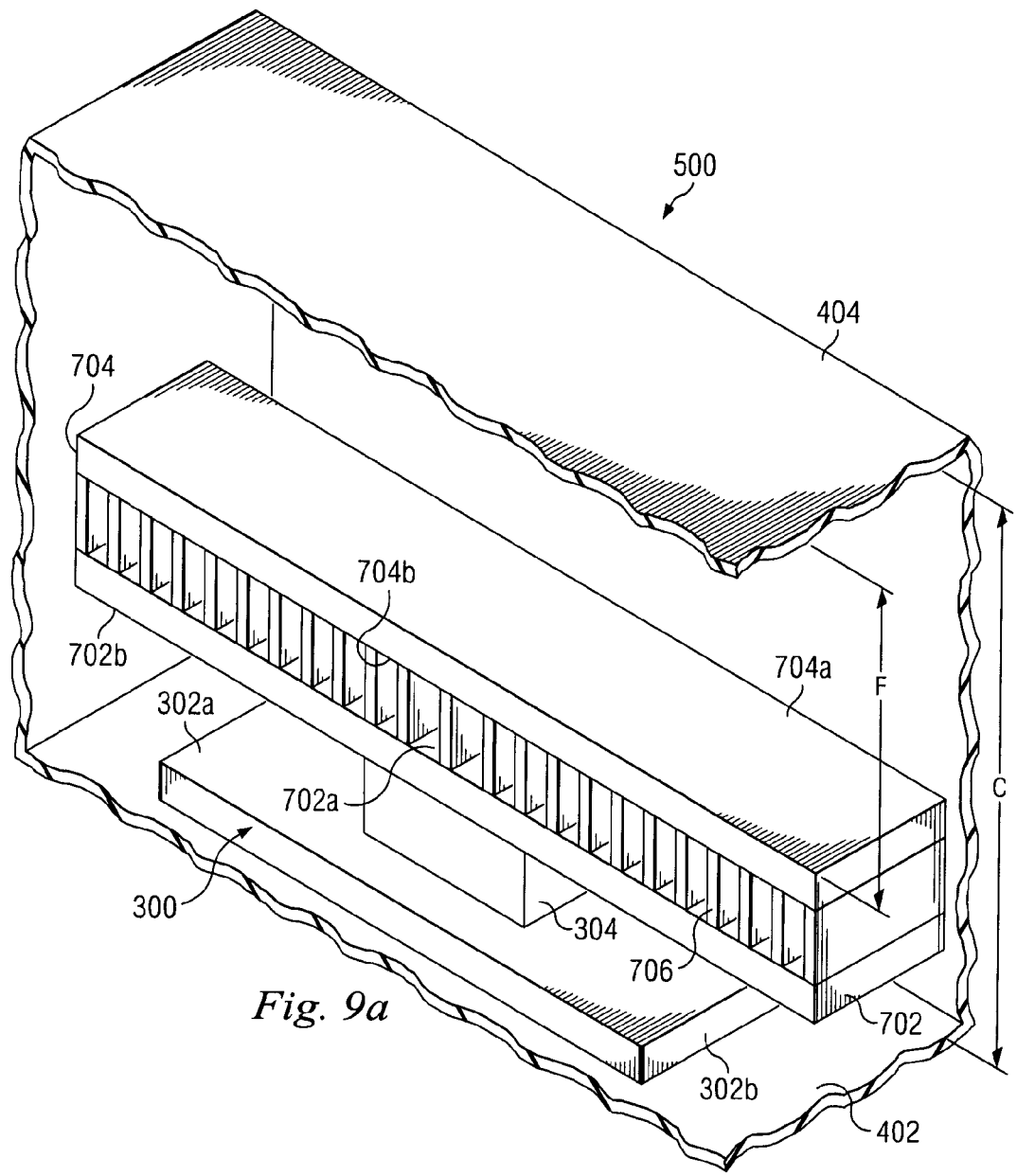

Referring now to FIG. 9a, the primary heat sink 700 may then be coupled to the die 304. Primary heat sink 700 is positioned over heat producing component 300 such that bottom surface 702b on first base member 702 of primary heat sink 700 is facing the top surface 306a of die 304. Bottom surface 702b on first base member 702 is then coupled to and engaged with top surface 306a of die 304. The bottom surface 702b on first base member 702 may be coupled to the top surface of die 304 by a variety of methods known in the art such as, for example, an adhesive thermal interface material and/or a mechanical fastener. With the primary heat sink 700 coupled to the heat producing component 300 in high profile form factor chassis 500, an internal height F between the secondary heat sink coupling surface 704a and the lid 404 of chassis 400 is sufficient to allow the secondary heat sink 200, illustrated in FIG. 3, to be coupled to the primary heat sink 700.

Figure 9B:
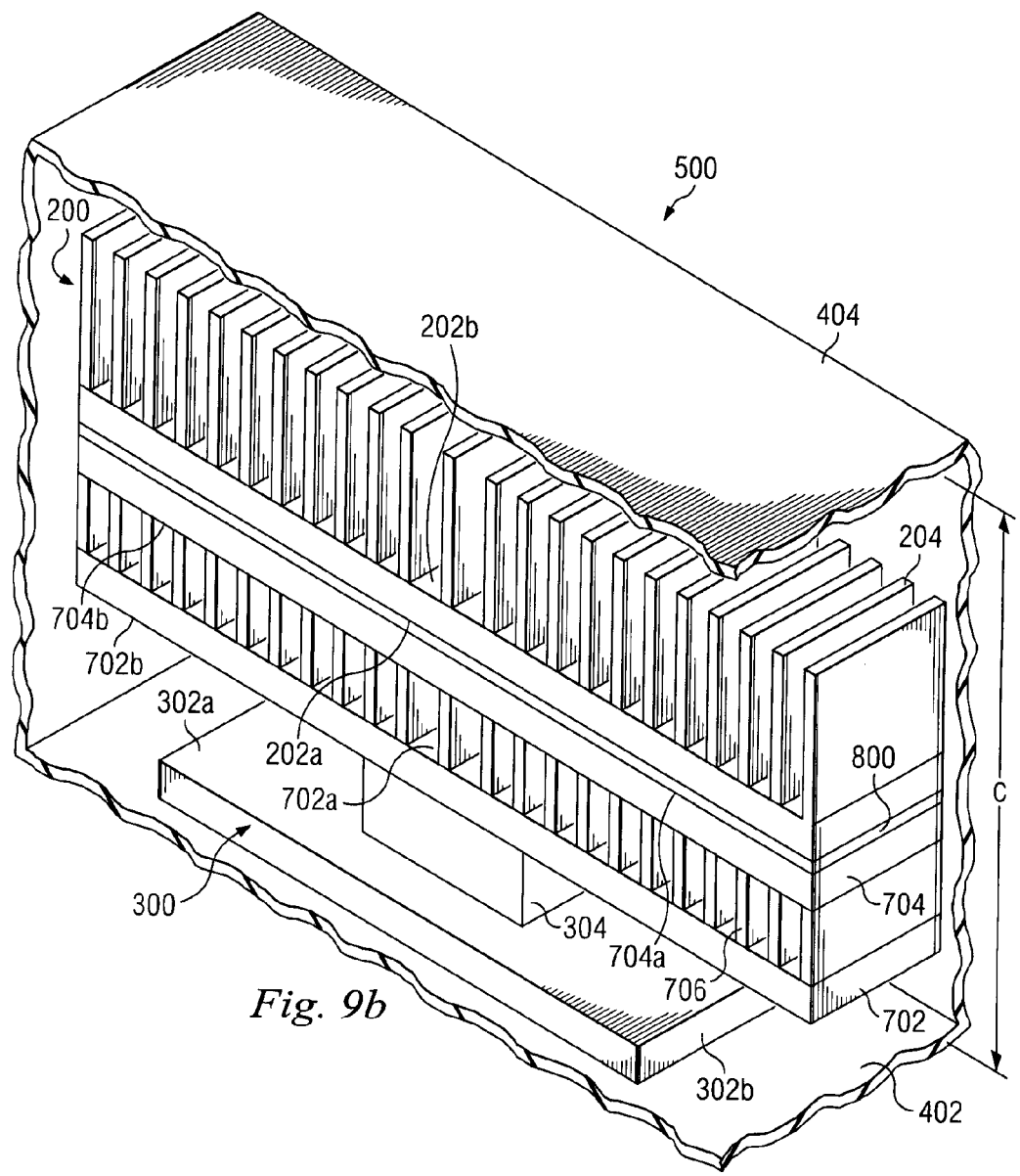

Referring now to FIGS. 3, 9a, and 9b, the secondary heat sink 200 may then be coupled to the primary heat sink 700. Secondary heat sink 200 is positioned in the high profile form factor chassis 500 such that bottom surface 202a of secondary heat sink 200 is adjacent secondary heat sink coupling surface 704a on second base member 704 of primary heat sink 700. Secondary heat sink 200 may then be coupled to the primary heat sink 700 with the use of an adhesive thermal interface material 800 which couples the bottom surface 202a of secondary heat sink 200 to the secondary heat sink coupling surface 704a on second base member 704 of primary heat sink 700. In an embodiment, the bottom surface 202a of secondary heat sink 200 may be coupled to the secondary heat sink coupling surface 704a on second base member 704 of primary heat sink 700 using alternative methods known in the art such as, for example, with the use of mechanical fasteners. Thus, the primary heat sink 700 and the secondary heat sink 200 provide a thermal dissipation apparatus which may be used to provide thermal dissipation in a low profile form factor chassis but allows more optimal thermal dissipation in a high profile form factor chassis.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A variable thermal dissipation method comprising:
providing a first chassis and a second chassis, wherein the first chassis defines a first internal height and the second chassis defines a second internal height that is greater than the first internal height;
providing a plurality of first heat sinks, wherein each of the first heat sinks are sized to allow the first heat sink to be positioned within the first internal height defined by the first chassis and within the second internal height defined by the second chassis:
providing a second heat sink, wherein the second heat sink is sized to allow the combination of the second heat sink mounted to the first heat sink to be positioned within the second internal height defined by the second chassis but not positioned within the first internal height defined by the first chassis;
mounting at least one of the first heat sinks on each of a heat producing component that is located in the first chassis and a heat producing component that is located in the second chassis;
determining the need for added thermal dissipation for the heat producing component that is located in the second chassis; and
in response to the determining, mounting the second heat sink on the first heat sink that was mounted on the heat producing component that is located in the second chassis.

2. The method of claim 1 wherein the first heat sink includes fins all having an equal height.

3. The method of claim 1 wherein the first heat sink includes fins having variable heights.

4. The method of claim 2 wherein the first heat sink includes a pair of base members and the fins extend between the base members.

5. The method of claim 3 wherein the first heat sink includes a base member and the fins extend from the base member.

6. A variable thermal dissipation method comprising;
providing a first chassis defining a first internal height;
providing an information handling system (IHS) in the first chassis, wherein the IHS includes a heat producing component;
mounting a first heat sink on the heat producing component, wherein the first heat sink is sized to allow the first heat sink to be positioned within the first internal height defined by the first chassis;
optionally, replacing the first chassis with a second chassis, wherein the second chassis defines a second internal height that is greater than the first internal height; and
whereby, due to the replacing, added space is provided for mounting a second heat sink on the first heat sink, wherein the second heat sink is sized to allow the combination of the second heat sink mounted to the first heat sink to be positioned within the second internal height defined by the second chassis but not positioned within the first internal height defined by the first chassis.

7. The method of claim 6 wherein the first heat sink includes fins each having an equal height.

8. The method of claim 7 wherein the first heat sink includes a pair of base members and the fins extend between the base members.

9. The method of claim 6 wherein the first heat sink includes fins having variable heights.

10. The method of claim 9 wherein the first heat sink includes a base member and the fins extend from the base member.

11. The method of claim 10 wherein the fins extend toward the heat producing component.

* * * * *